United States Patent [19]

Skarvinko et al.

[11] 4,022,371
[45] May 10, 1977

[54] VAPOR BONDING METHOD

[75] Inventors: Eugene Roman Skarvinko, Binghamton; William Ditlef von Voss, Endicott, both of N.Y.

[73] Assignee: International Business Machines Corporation, Armonk, N.Y.

[22] Filed: June 14, 1976

[21] Appl. No.: 695,482

[52] U.S. Cl. .............................. 228/223; 228/242
[51] Int. Cl.$^2$ ......................................... B23K 1/04
[58] Field of Search ........................... 228/223, 242

[56] References Cited
UNITED STATES PATENTS

| | | | |
|---|---|---|---|
| 2,842,841 | 7/1958 | Schnable et al. | 228/223 |
| 3,436,278 | 4/1969 | Poliak | 228/223 X |
| 3,734,791 | 5/1973 | Poliak | 228/223 X |
| 3,904,102 | 9/1975 | Chu et al. | 228/242 X |

Primary Examiner—James L. Jones, Jr.
Assistant Examiner—K. J. Ramsey
Attorney, Agent, or Firm—Cyril A. Krenzer

[57] ABSTRACT

Components, printed circuit board assemblies and the like to be interconnected by soldering are appropriately fluxed and placed in an atmosphere of a saturated vapor derived from a heat transfer liquid medium having a boiling point above the melting point of the solder. The heat transfer medium is chosen to have a solubility parameter compatible with the solubility parameter of the flux to eliminate the need for subsequent flux cleaning.

An alternate embodiment includes a fatty acid in the heat transfer medium, which under some circumstances can eliminate the need to apply flux to the assembly being soldered.

13 Claims, 1 Drawing Figure

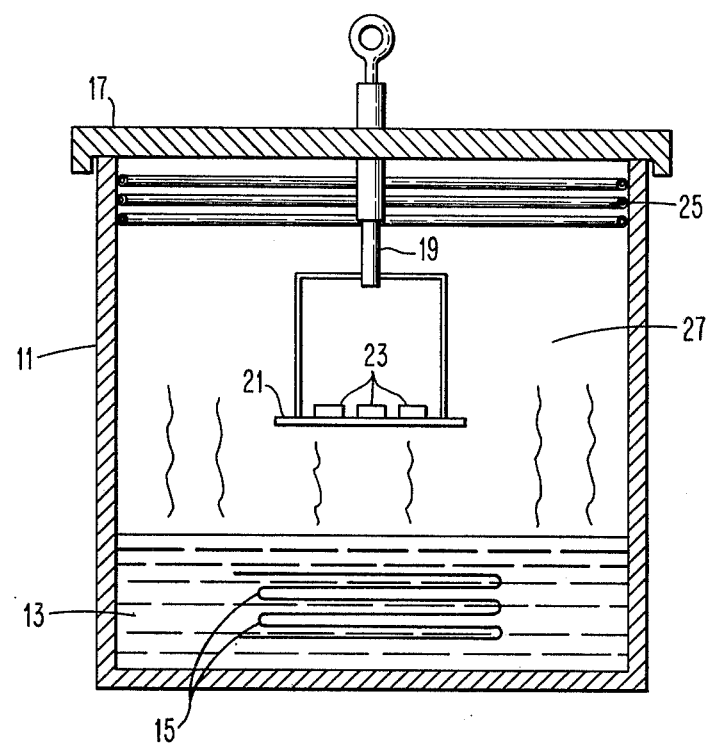

VAPOR BONDING METHOD

BACKGROUND OF THE INVENTION

1. Field of the Invention

This invention relates generally to an improved bonding method and more particularly to an improved vapor bonding method.

2. Description of the Prior Art

Soldering and reflow soldering methods for manufacturing electronic circuitry and the like are accomplished by the application of appropriate heat to the solder material and/or to the articles to be bonded together by soldering. Typically, the heat can be applied by using a soldering iron, by using a reflow oven, by using infrared radiation and more recently by placing the assembly to be soldered in an appropriate vapor atmosphere. Generally the soldering process includes the application of a flux to the surface to be soldered to clean the surface by the removal of any contaminate including any oxide layer developed thereon. The known methods for heating the surfaces to be soldered, while achieving the necessary objective of melting the solder, often, as an undesirable side effect, also necessarily subjects the flux to excessive heat which can result in a baked, polymerized product, often difficult to remove. This can be particularly critical when ultraclean circuitry and freedom from corrosive residue is desired. Furthermore, the application of the flux to the unit and the subsequent removal of the flux residues repairs additional steps, processing time and equipment.

Making solder bonds by the use of soldering irons, reflow ovens and infrared radition are, of course, well known in the art. The idea of using a hot saturated vapor as a heat transfer medium to heat the article to be soldered to the desired temperature is of relatively recent origin. An example of such a technique is shown in U.S. Pat. No. 3,866,307, entitled "Method for Soldering, Fusing or Brazing," which patent describes the use of fluorocarbons, such as fluorinated polyoxypropylene, as heat transfer mediums which are heated to their boiling point in a suitable enclosure to produce a hot saturated vapor into which the article to be soldered is placed. Unfortunately, these liquids have relatively low solubility parameters and, as such, they are not particularly effective in cleaning the article to be soldred prior to the soldering operation, or in cleaning the article being soldered and removing a flux residue after the soldering operation.

OBJECTS AND SUMMARY OF THE INVENTION

Accordingly, it is a principal object of this invention to provide an improved vapor bonding method which overcomes the foregoing disadvantages of the prior art.

Another object of the invention is to provide an improved vapor bonding method which is operative to bond and clean the assembly in the same atmosphere.

A more specific object of the present invention is to provide an improved method for vapor soldering, which removes the solder flux by means of the vapor.

Yet another object of the present invention is to provide an improved vapor soldering method which can obviate the need for a discrete application of solder flux to the assembly being soldered.

Briefly, the foregoing and other objects are accomplished according to one aspect of the invention wherein a liquid solvent, such as octanol-1, is placed in an enclosed vessel and brought to boiling. Circuitized electronic assemblies, suitably fluxed, with solder preforms positioned in the desired locations, are placed in the enclosed vessel for approximately one minute. Upon removal from the vessel, the circuitized apparatus had well soldered, clean joints.

In an alternate embodiment of the invention, a carboxylic acid compatible with the solvent is combined with the solvent and placed in an enclosed vessel. The combined liquid is brought to its boiling point and thereafter the assembly to be soldered is placed in the heated vapor for about one minute. Upon removal, the soldered assembly had clean, well wetted solder bond without requiring the direct application of a solder flux.

BRIEF DESCRIPTION OF THE DRAWING

The accompanying FIGURE is a diagrammatic representationof a sectional elevational view of apparatus adapted to the method of solder bonding in a heated vapor according to the present invention.

DESCRIPTION OF THE PREFERRED EMBODIMENTS

The foregoing and other objects, features and advantages of the invention will be apparent from the following more particular description of the preferred embodiments thereof taken in conjunction with the above described accompanying drawing.

Referring first to the accompanying drawing, therein is shown a vessel 11 adapted to hold a liquid 13 in which there is contained an appropriate heating element 15. The upper part of the vessel 11 is closed by a cover 17 which includes a support member 19 adapted to carry a tray 21, or the like, which supports the assemblies 23 to be soldered. Around the top inner portion of the container is a suitably mounted condenser coil 25. The area 27 above the liquid 13 will contain the saturated vapor resulting from the boiling of the liquid 13.

In operation, the assemblies 23 to be vapor bonded are appropriately prepared including fluxing, if necessary, and are held by the support member 19 in the top 17. The heating coil 15 operates to bring the liquid 13 to a boil to create a saturated vapor in the upper space 27 of the container 11. The top 17 with the assemblies 23 supported on the carrier 21 is placed in position so that the assemblies 23 are in the heated, saturated vapor 27. The assemblies 23 are kept in the vapor 27 to carry out the desired flowing of the solder bonding material under the influence of the vapor 27. After a sufficient period of time, the top 17 is removed and the assemblies 23 are taken from the atmosphere 27. The condenser coil 25 operates to prevent the escape of the vapor from the container 11 by cooling the vapor below its boiling point.

The foregoing description of the drawing illustrates the purely functional steps involved in practicing the present invention. Any suitable apparatus, including that shown and described in U.S. Pat. No. 3,866,307 can be used to carry out the solder bonding operation in accordance with the teaching of the present invention.

In the practice of the instant invention, it is necessary that the heat transfer medium possess certain properties compatible with the solder and flux system being used. The liquid must have a boiling point which is compatible with the solder system (e.g. for eutectic tin-lead solder, the boiling point should be on the order of 200° C). The liquid and its vapor must be nonreactive with any organics in the circuitized assemblies 23. The liquid and its vapor must also be stable in atmosphere; that is, they must not burn, carbonize, etc. In addition, the liquid and its vapor must be reasonably economical and must have a solubility parameter compatible with that of the flux which is applied to the assemblies being soldered.

Using such liquids and their associated vapors, it is found that the work being solder bonded is subjected to an exact and uniform temperature, without danger of overheating. Futhermore, by the appropriate choice of solubility parameters, the flux is removed from the substrate being soldered in the same operation. Because of the absence of the air in the vapor system, there is no oxidation of metal surfaces.

EXAMPLE I

For the soldering of components to and the making of interconnections on a circuitized electronic assembly, the following system is used:

1. The areas to be soldered are first fluxed with an activated rosin flux. The liquid 13 in the container 11 in octanol-1 having a solubility parameter of 10.3 and a boiling point of approximately 195° C. Using the heating coil 15, the liquid is brought to a boil and establishes a saturated vapor 27 in the vessel 11. Prior to the fluxing of the board, solder preforms or other appropriate solder materials are applied to the assemblies 23 to be soldered and the assemblies are placed in the container for approximately 1 minute. Thereafter, the assemblies are removed from the container through the condenser 25.

EXAMPLE II

The system and method of Example I are followed except the diethylene glycol meonoethyl ether (carbitol) having a boiling point of 202.7° C and a solubility parameter of 10.3, is substituted for the octanol-1 of Example I.

Using either the octanol-1 of Example I or the diethylene glycol monoethyl ether of Example II, it is found that there is the simultaneous soldering and cleaning of the apparatus in the vapors. The removal of the flux in the same operation, eliminates the need for an additional flux removal step, thereby enhancing the economics of the method. This flux removal is believed to be mainly a result of having the solubility parameter of the liquid and its vapor compatible with the solubility parameter of the rosin which is the main constituent of a flux.

According to another aspect of the invention, it has been found that the solder bonding can be accomplished without applying a discrete flux to the assemblies 23 prior to the bonding process. This is accomplished by using a member of the organic fatty acid family in combination with the solvent which will form the heated vapor. According to this aspect of the invention, the solvent characterisitcs must be such that: it has a boiling point compatible with the solder alloy being used; it must not significantly degrade any portion of the assemblies being bonded; it must be stable in atmosphere; and it should be reasonably economical. In the vapor stage, it must be miscible with the fatty acid being used. The fatty acid should be mildly reactive, but not such as to adversely affect any of the material of the assemblies being bonded, and must not leave any insoluble residue.

EXAMPLE III

A liquid comprising 95% by volume of octanol-1 and 5% by volume of acetic acid are mixed together and comprise the liquid 13 used as the heat transfer mechanism. The solution is brought to its boiling point in the enclosed vessel 11 and thereafter, the assemblies 23 be bonded with the solder performs in position are placed in the vessel and held for about one minute. Thereafter, the assemblies 23 are removed from the vapor, resulting in well soldered, uniform connections.

EXAMPLE IV

The system is the same as in Example III except that the acetic acid is replaced by hexanoic acid in the heat transfer medium 13.

EXAMPLE V

The solution used as the heat transfer medium is comprised of approximately 95% by volume of diethylene glycol monomethyl ether and approximately 5% by volume of either hexanoic or acetic acid. The other characteristics of the system and the bonding method are the same as found in Example III above.

Using the systems and method of Examples III through V, it is found that there is a savings on material and time because of the elimination of a separate fluxing step. Also there is the elimination of a separate cleaning process for the removal of any flux which otherwise might be baked on the assemblies, only a simple rinse being required to remove the residual high boiling solvent. As is the case with Examples I and II, there is an improved quality of bonds because of the closer control of the temperature.

It is recognized that there will be situations based upon system designs, requirements, etc. where it will be necessary to use a flux in the bonding operation. In those cases the methods of Examples I and II would be preferred.

In Examples III through V, it is state that the solvent comprises 95% by volume of the liquid and the acid comprises 5% by volume of the liquid. It has been found that the solvent can comprise between 92 and 98% (preferably 94 to 96%) of the liquid heat transfer medium and the acid can comprise between 2 and 8% (preferably 4 to 6%) by volume of the liquid heat transfer medium.

While the invention has been described in terms of the preferred embodiments, it will be readily apparent to those skilled in the art that other modifications and variations may be made therein without departing from the scope or spirit of the invention. For example, it has been described as a method which is operative at atmospheric pressure, yet it will be realized that varying pressurized or reduced pressure atmospheres can be used depending upon the system requirements and preferences. It is also recognized that the invention can be carried out as a continuous system where the assemblies to be bonded are transferred through the vapor of the system from a prescribed period of time. It is therefore intended that the invention not be limited to the specifies of the foregoing description of the preferred embodiments, but rather is to embrace the full scope of the following claims.

We claim

1. A method for simultaneously soldering, fluxing and cleaning an article of manufacture, comprising the steps of:

bringing a heat transfer medium to a boil in an enclosure to generate a substantially saturated vapor atmosphere, the heat transfer medium having a boiling point greater than the melting point of the solder, and having a solubility parameter substantially the same as the solubility parameter of the flux material used with said solder;

applying solder and flux to said article of manufacture;

introducing said article of manufacture together with said solder into said substantially saturated vapor atmosphere to effect the flow of said solder on said article of manufacture and simultaneously effect the dissolving of any excess flux from said article of manufacture by said vapor; and removing said article of manufacture from said vapor atmosphere.

2. The invention according to claim 1 wherein said solder is eutectic, tin-lead solder and said flux is a rosin flux.

3. The invention according to claim 2 wherein said heat transfer liquid is chosen from the group consisting of octanol-1 and diethylene glycol monoethyl ether.

4. A method of boiling components to an article of manufacture by flowing a bonding material between the components and the article of manufacture comprising the steps of:

bringing a heat transfer medium to a boil in an enclosure to generate a substantially saturated vapor atmosphere, said heat transfer medium comprising from 92 to 98% of a solvent and from 2 to 8% of a fatty acid, said solvent having a boiling point greater than the melting point of said bonding material and being miscible with said fatty acid;

introducing said article of manufactue with said components and bonding material into said substantially saturated vapor atmosphere to effect the flow of said bonding material between said components and said article of manufacture; and removing said article of manufacture.

5. The invention according to claim 4 wherein said bonding material is eutectic, tin-lead solder.

6. The invention according to claim 5 wherein said solvent is octanol-1 and said acid is hexanoic acid.

7. The invention according to claim 6 wherein said heat transfer medium comprises approximately 95% by volume of octanol-1 and 5% by volume of hexanoic acid.

8. The invention according to claim 5 wherein said solvent is diethylene glycol monoethyl ether and said acid is hexanoic acid.

9. The invention according to claim 8 wherein said heat transfer medium comprises approximately 95% by volume of diethylene glycol monoethyl ether and 5% by volume of hexanoic acid.

10. The invention according to claim 4 wherein said solvent is chosen from the group consisting of octanol-1 and diethylene glycol monoethyl ether.

11. The invention according to claim 4 wherein said fatty acid is chosen from the group consisting of acetic aicd and hexanoic acid.

12. The invention according to claim 4 wherein said bonding material is solder, said solvent is octanol-1 and said acid is acetic acid.

13. The invention according to claim 12 wherein said heat transfer medium comprises approximately 95% by volume of octanol-1 and approximately 5% by volume of acetic acid.

* * * * *